United States Patent
Adachi

(10) Patent No.: US 7,491,107 B2
(45) Date of Patent: Feb. 17, 2009

(54) PLASMA DISPLAY PANEL PRODUCING METHOD, AND PLASMA DISPLAY PANEL

(75) Inventor: Daisuke Adachi, Kyoto (JP)

(73) Assignee: Panasonic Corporation, Osaka (JP)

( * ) Notice: Subject to any disclaimer, the term of this patent is extended or adjusted under 35 U.S.C. 154(b) by 681 days.

(21) Appl. No.: 10/511,750

(22) PCT Filed: Feb. 23, 2004

(86) PCT No.: PCT/JP2004/002066

§ 371 (c)(1),
(2), (4) Date: Oct. 19, 2004

(87) PCT Pub. No.: WO2004/077484

PCT Pub. Date: Sep. 10, 2004

(65) Prior Publication Data

US 2005/0215162 A1    Sep. 29, 2005

(30) Foreign Application Priority Data

Feb. 28, 2003  (JP)  ............................ 2003-052851

(51) Int. Cl.
    *H01J 17/49* (2006.01)
(52) U.S. Cl. ........................................ 445/46; 313/582
(58) Field of Classification Search ......... 313/581–587; 315/169.4; 345/37, 41, 60; 445/46, 58
    See application file for complete search history.

(56) References Cited

U.S. PATENT DOCUMENTS

| 6,891,331 | B2 * | 5/2005 | Ashida et al. | ............... 313/582 |
| 2005/0134177 | A1 * | 6/2005 | Asida et al. | ................. 313/582 |

FOREIGN PATENT DOCUMENTS

| JP | 63-258022 | 10/1998 |
| JP | 2002-150856 | 5/2002 |
| JP | 2002-163945 | 6/2002 |
| JP | 2002-216640 | 8/2002 |
| WO | WO 02/19369 A1 | 3/2002 |

* cited by examiner

*Primary Examiner*—Nimeshkumar D. Patel
*Assistant Examiner*—Christopher M Raabe
(74) *Attorney, Agent, or Firm*—McDermott Will & Emery LLP

(57) ABSTRACT

The present invention provides a method of manufacturing a PDP that prevents a defect from occurring in a structure of the PDP; and also suppresses retroflexion, exfoliation, and the like, of the structure. In photolithography, exposure is performed twice with a first and a second photomasks, each having a different aperture width, but the same exposure pattern. The amount of exposure is different between first exposure region (A') through the first photomask; and second exposure region (B') through the second photomask.

17 Claims, 3 Drawing Sheets

PLASMA DISPLAY PANEL PRODUCING METHOD, AND PLASMA DISPLAY PANEL

TECHNICAL FIELD

The present invention relates to a manufacturing method for forming a structure of a plasma display panel (hereinafter, abbreviated as "PDP") that is known as a large-screen, thin, and lightweight display device, and to a PDP manufactured with the manufacturing method.

BACKGROUND ART

A PDP displays images by exciting a phosphor substance with ultraviolet light generated by gas discharge for light emission.

A PDP is roughly classified into the AC type and DC type by driving method, and the surface-discharge type and opposed-discharge type by discharging method.

In terms of moving to finer-resolution, an increase in the screen size, and easiness in manufacturing owing to simplicity of the structure, a PDP nowadays prevails with a three-electrode structure and the surface-discharge type.

A PDP is composed of a front panel and a back panel. The front panel has display electrodes including scanning electrodes and sustain electrodes; a dielectric layer covering the display electrodes; and a protective layer further covering the dielectric layer, on a substrate made of glass or the like. The back panel has a plurality of address electrodes orthogonal to the display electrodes, a dielectric layer covering the address electrodes, and partition walls on the dielectric layer. Arranging the front panel and the back panel facing each other forms a discharge cell at the intercept of the display electrode and the data electrode, where the discharge cell has a phosphor layer.

Such a PDP offers high-speed display as compared with a liquid crystal panel. In addition, it features a wide viewing angle, easy upsizing, and a high-quality display owing to its self-luminous property, attracting attention among flat-panel displays. It is widely used in various applications, particularly for a display device in a public place where many people gather, and for enjoying a large-screen image at home.

In a PDP, for example, a display electrode and address electrode require a relatively high accuracy in their shapes and allocation pitches.

Therefore, so-called photolithography is used, where the whole surface of the substrate is coated with a conducting material such as a metallic material, containing a photosensitive material, which is exposed and developed using a photomask with an electrode pattern. A method for forming an electrode with a predetermined shape at a predetermined position of a substrate using a lithographic process is introduced in, for example, the 2001 FPD Technology Outlook (Electronic Journal, Co., Oct. 25, 2000, pp. 589-594, pp. 601-603, and pp. 604-607).

Here, the photosensitive material hardens with a cross-linking reaction due to an exposure, and an overexposure may occur depending on its exposure conditions. In such a case, the cross-linking reaction proceeds excessively, causing the electrode film to indwell a stress. Baking under this condition may contract the electrode film, causing retroflexion and exfoliation, on the edge of a pattern for a structure such as an address electrode, of a PDP. This is an example for an electrode. In a PDP, despite its large screen, a structure other than an address electrode also requires accuracy. Consequently, photolithography may be used to form a structure, such as a partition wall, other than an electrode. Such a case may also cause the problems as mentioned above in image display.

These problems may adversely affect a display image.

SUMMARY OF THE INVENTION

The present invention, in a manufacturing method for forming a structure of a PDP with photolithography, aims at providing a manufacturing method and a PDP manufactured therewith that suppress retroflexion, exfoliation, and the like, in the formed structure.

In order to achieve the above-mentioned objective, the method of manufacturing a PDP according to the present invention is to form a structure of the PDP using photolithography, where at least one of the above-mentioned structures of the PDP is exposed using a plurality of photomasks with a same pattern and a different aperture width of the exposure part, in its forming process.

In addition, in order to achieve the above-mentioned objective, the PDP manufactured according to the present invention has a structure formed with photolithography, where at least one of the structures has a different degree of a cross-linking reaction between the edge part and central part of the pattern shape, immediately after the exposure; more specifically the central precedes the edge.

DETAILED DESCRIPTION OF PREFERRED EMBODIMENTS

Hereinafter, some descriptions are made for methods of manufacturing a PDP according to embodiments of the present invention using drawings.

Embodiment 1

Figure 1:
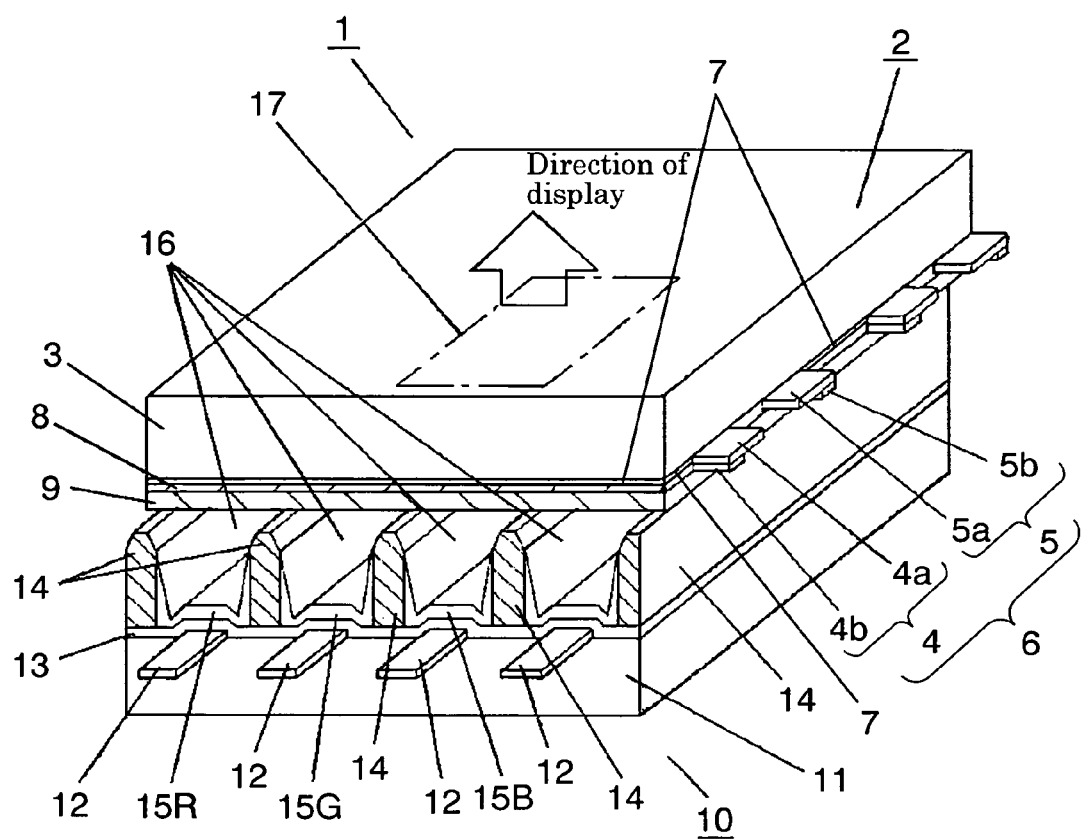
FIG. 1 is a perspective sectional view showing an example of a general makeup of a PDF manufactured with a manufacturing method according to an embodiment of the present invention.

First, a description is made for a structure of a PDP. FIG. 1 is a perspective sectional view showing an example of a general makeup of a PDP manufactured with a manufacturing method according to an embodiment of the present invention.

Front panel 2 of PDP 1 has display electrode 6 including scanning electrode 4 and sustain electrode 5 formed on a main surface of substrate 3, which is smooth, transparent, and insulative, like glass, made with float process or the like.

Front panel 2 further includes light-impervious layer 7 provided between display electrode 6 and another adjacent one; dielectric layer 8 covering display electrode 6 and light-impervious layer 7; and also protective layer 9 covering dielectric layer 8, containing MgO, for example.

Scanning electrode 4 and sustain electrode 5 are structured so that bus electrodes 4b and 5b are laminated on transparent electrodes 4a and 5a, respectively, made of a highly-conductive material such as a metallic material, in order to reduce electrical resistance. Light-impervious layer 7 shields white light coming from a phosphor layer (described later) when non-emitting, effectively improving contrast.

Back panel 10 has address electrode 12 formed on a main surface of substrate 11, which is smooth, transparent, and insulative, like glass, made with float process or the like, on the back surface; dielectric layer 13 covering the address electrode 12; partition wall 14 arranged at a position corresponding to between address electrode 12 and another adjacent one, on dielectric layer 13; and phosphor layers 15R, 15G, and 15B, between the partition wall 14 and another adjacent one.

Front panel 2 and back panel 10 are arranged facing each other across partition wall 14, so that display electrode 6 and address electrode 12 are orthogonalized, and the peripheries of front panel 2 and back panel 10 are sealed with a sealing member. In discharge space 16 formed between front panel 2 and back panel 10, a discharge gas (e.g. 5% of Ne—Xe) is encapsulated with a pressure of 66.5 kPa (500 Torr).

The intercept of display electrode 6 and address electrode 12 in discharge space 16 works as discharge cell 17 (a unit of light-emitting region).

Next, a description is made for a method of manufacturing PDP 1 referring to FIG. 1.

In order to manufacture front panel 2, first form scanning electrode 4 and sustain electrode 5 on substrate 3, like stripes for example. Specifically, form a film, which is a material of transparent electrodes 4*a* and 5*a*, made of indium tin oxide (ITO) or the like, on substrate 3, using electronic beam evaporation technique, for example. Then pattern a resist on the ITO film so that the resist remains as the pattern for transparent electrodes 4*a* and 5*a*. In this state, etch transparent electrodes 4*a* and 5*a*, and then exfoliate the resist to form transparent electrodes 4*a* and 5*a* like stripes. Still, $SnO_2$ or the like can be also used as the transparent electrode material.

Next, form bus electrodes 4*b* and 5*b* on transparent electrodes 4*a* and 5*a*. Use black pigment, glass frit (PbO—$B_2O_3$—$SiO_2$ base, $Bi_2O_3$—$B_2O_3$—$SiO_2$ base, etc.), polymerization initiator, photo-sclerotic monomer, and photosensitive black paste containing an organic solvent, for the materials of bus electrodes 4*b* and 5*b*.

Then, after forming a black electrode film on the glass substrate with the photosensitive black paste, using screen printing or the like, dry it. Continuously, form a metal electrode film on the black electrode film, using screen printing or the like, with a conducting material containing Ag, glass frit (PbO—$B_2O_3$—$SiO_2$ base, $Bi_2O_3$—$B_2O_3$—$SiO_2$ base, etc.), polymerization initiator, photo-sclerotic monomer, photosensitive Ag paste containing an organic solvent; and dry it again. After that, make a pattern with photolithography, and bake it to form bus electrodes 4*b* and 5*b*.

The above-mentioned manufacturing method allows forming display electrode 6 including scanning electrode 4 and sustain electrode 5.

Next, form light-impervious layer 7. That is, after forming a film with a photosensitive black paste using screen printing or the like, make a pattern with photolithography, and then bake it. Here, light-impervious layer 7 may be formed concurrently with the base black layers of bus electrodes 4*b* and 5*b*. A forming method without using a paste may be exploited as long as the photosensitive paste is black. Still, light-impervious layer 7 may be formed before bus electrodes 4*b* and 5*b* are formed.

Next, cover display electrode 6 and light-impervious layer 7 with dielectric layer 8, which is formed by applying a paste containing a lead-based glass material, using screen printing or the like. Then, bake the paste at a predetermined temperature for a predetermined time, at 560° C. for 20 minutes for example, to form dielectric layer 8 with a predetermined thickness, approximately 20 μm, for example.

As a paste containing a lead-based glass material, a mixture of PbO (70 wt %), $B_2O_3$ (15 wt %), $SiO_2$ (10 wt %), and $Al_2O_3$ (5 wt %); and an organic binder (e.g. alpha-terpineol with 10% ethycellulose dissoluted) is used. Here, the organic binder is an organic solvent with a resin dissoluted therein, where, besides ethycellulose, an acrylic resin can be used as the resin; and n-butylcarbitol, for example, can be used as the organic solvent.

Moreover, a dispersing agent such as glyceryl trileate may be mixed in such an organic binder. Still, instead of screen printing using a paste, a molded, film-like dielectric precursor may be laminated and baked to form dielectric layer 8.

Next, cover dielectric layer 8 with protective layer 9. Protective layer 9 includes MgO or the like, as its principal component. Form protective layer 9 so that it has a predetermined thickness, approximately 0.5 μm for example, with a film-forming process such as deposition or sputtering.

Meanwhile, for back panel 10, address electrode 12 is formed on substrate 11, like stripes. Specifically, form a film with screen printing or the like, on substrate 11, using a photosensitive Ag paste for example, to be a material of address electrode 12; make a pattern with photolithography or the like; and bake it to form address electrode 12.

Next, cover address electrode 12 with dielectric layer 13, which is formed by applying a paste containing a lead-based glass material, with screen printing or the like. Then, bake the paste at a predetermined temperature for a predetermined time, at 560° C. for 20 minutes for example, to form dielectric layer 13 with a predetermined thickness, approximately 20 μm.

Instead of screen-printing a paste, a molded, film-like base dielectric layer precursor may be laminated and baked to form dielectric layer 13.

Next, form partition wall 14 like stripes, for example. Form a film with a photosensitive paste having an aggregate such as $Al_2O_3$, and glass frit as their base resin, with a printing method, die coating, or the like; make a pattern with photolithography; and bake it to form partition wall 14. Alternatively, forming may be performed, after repeatedly applying a paste containing a lead-based glass material, with screen printing or the like, at a predetermined pitch, by baking it. Here, the gap between partition walls 14 is approximately 130 μm to 240 μm for a HD-TV with its screen size of 32 to 50 inches, for example.

In the groove between partition wall 14 and another adjacent one, form phosphor layers 15R, 15G, and 15B composed of the respective phosphor particles red (R), green (G), and blue (B). In order to form these layers, apply a phosphor ink paste including phosphor particles with each color and an organic binder; and bake it at 400° C. to 590° C., for example, to burn out the organic binder. This forms phosphor layers 15R, 15G, and 15B with each phosphor particle binding.

Lay front panel 2 and back panel 10 so that display electrode 6 on front panel 2 and address electrode 12 on back panel 10 are orthogonalized; insert a sealing member such as sealing glass to the peripheries of front panel 2 and back panel 10; and seal them with a hermetic seal layer (not illustrated) formed by baking it at approximately 450° C. and for 10 to 20 minutes, for example. Then, after once exhausting discharge space 16 with high vacuum, $1.1*10^{-4}$ Pa for example, encapsulate a discharge gas (e.g. a He—Xe-based or Ne—Xe-based inert gas) with a predetermined pressure to produce PDP 1.

While PDP 1 in this case has a large screen, the structures of PDP 1, such as display electrode 6, light-impervious layer 7, address electrode 12, and partition wall 14, require accuracy in their shapes and positions; and thus photolithography is widely used for a method of forming these structures.

Hereinafter, a description is made for photolithography, namely a method of manufacturing a PDP according to the present invention, taking address electrode 12, namely a structure of PDP 1, for example, mainly about the exposure process, namely a feature of the present invention, using drawings.

FIGS. 2A through 2D illustrate a general flow of the process to form address electrode 12.

Figure 2A:
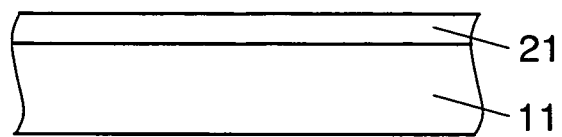
FIGS. 2A through 2D illustrate a process to form an address electrode, which is a structure of a PDP according to the present invention.

First, as shown in FIG. 2A, apply a uniform coating of a photosensitive Ag paste with screen printing or the like, to form photosensitive Ag paste film 21 on substrate 11. Ag paste film 21 becomes a precursor of address electrode 12 shown in FIG. 1.

Figure 2B:
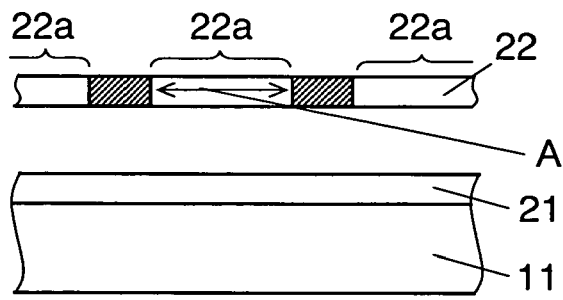

Next, as shown in FIG. 2B, arrange photomask 22 including an exposure pattern for making address electrode 12 with photolithography, positioning at a predetermined position on substrate 11. In FIG. 2B, the unhatched area of first photomask 22 is an open part of aperture width A, becoming exposure part 22a.

Figure 2C:
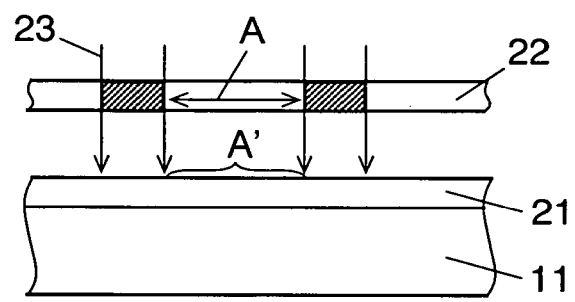

Next, as shown in FIG. 2C, perform a first exposure on photosensitive Ag paste film 21 through photomask 22. Specifically, illuminate with ultraviolet light 23 using an extra-high-pressure mercury lamp.

Figure 2D:
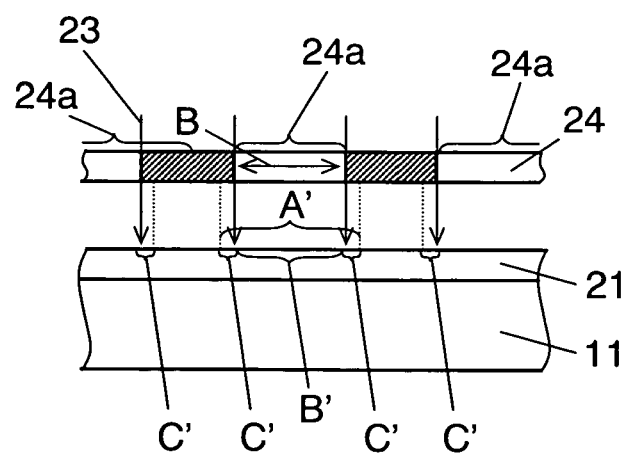

Next, as shown in FIG. 2D, arrange a second photomask 24 including an exposure pattern that is the same as that of the first photomask 22, but is different in aperture width B of the open part, for making address electrode 12 with photolithography, positioning at a predetermined position. In FIG. 2D, the unhatched area of the second photomask 24 is an open part of aperture width B, becoming exposure part 24a.

In this way, form address electrode 12. That is, develop photosensitive Ag paste film 21 exposed with the pattern of address electrode 12 to make a pattern of address electrode 12 from photosensitive Ag paste film 21; and bake it.

Here, aperture width A of first photomask 22 and aperture width B of second photomask 24 are to have the following relations, in order to suppress the change in the wire width due to the displacement of regions exposed at the first and second times, due to their positioning error. That is, aperture width A of either of the photomasks, such as first photomask 22, is a predetermined aperture width to form a pattern of address electrode 12. Meanwhile, aperture width B of second photomask 24, which is the other photomask, has the same exposure pattern as that of first photomask 22, but aperture width B is shorter than aperture width A of first photomask 22.

Then, expose second photomask 24, positioning it so that the second exposure region falls within the first exposure region exposed through first photomask 22. Here, the size of aperture width B of exposure part 24a of second photomask 24 to that of aperture width A of exposure part 22a of first photomask 22, should be determined by the exposure pattern, positioning accuracy of each photomask, and material properties such as the contraction percentage of the photosensitive material when baking.

Further, in the above-mentioned exposure, let the amount of the first exposure be different from the second. Specifically, let the amount of exposure of the photomask with the longer aperture width, namely first photomask 22 in the above-mentioned example, be larger than that of the photomask with the shorter aperture width, namely second photomask 24 in the above-mentioned example.

More specifically, for example, let the amount of exposure with first photomask 22 be approximately two thirds of that required to expose photosensitive Ag paste film 21, while the amount of exposure with second photomask 24 be approximately one third of that required to expose photosensitive Ag paste film 21. In addition, let the sum of the first and second exposure amounts not exceed that required to expose photosensitive Ag paste film 21. According to the above-mentioned exposure process, photosensitive Ag paste film 21, in terms of its exposure history, is divided into two regions: region B' (the region exposed through exposure part 24a of second photomask 24), exposed twice (the first and second exposures); and region C' (the region of region A', namely the region exposed through exposure part 22a of first photomask 22, with region B' removed), exposed only once (the first exposure). Here, the edge part of the exposure pattern becomes region C', exposed only once; and thus the edge is overexposed very rarely, suppressing retroflexion and exfoliation due to a stress caused by an overexposure, on the edge part of the pattern.

Here, in the above-mentioned example, the amount directly exposed on the edge part of the exposure pattern is approximately two thirds of the exposure amount required. For an insufficient exposure amount, light illuminates the film surface first during exposure; and so the cross-linking reaction proceeds from the film surface first, resulting in sufficient hardening on the electrode film surface, but insufficient inside the electrode film. Even in such a case, the exposure pattern is subject to exfoliation and the like.

However, according to the above-mentioned exposure process, it has been experimentally proved that disadvantages such as exfoliation in an exposure pattern occur very rarely. This presumably results for the following reasons.

That is, the cross-linking reaction expands in a surface direction as well as in a film thickness direction during exposure. Therefore, during the second exposure, even if the edge part (region C') of the exposure pattern is not directly exposed, the cross-linking reaction expanding in its film surface direction shows that it is practically proceeding. From this fact, insufficient exposure problematic in forming a pattern presumably does not occur, although a predetermined exposure amount is not reached.

The above-mentioned description shows the procedure where the first large-amount exposure is made with the photomask of the longer aperture width; and then the second small-amount exposure with the shorter. Meanwhile, the reverse exposure process, where the first large-amount exposure is made with the photomask of the shorter aperture width; and then the second small-amount exposure with the longer, also exhibits the same effect.

The above-mentioned method of manufacturing a PDP according to embodiment 1 of the present invention, offers a desirable pattern exposure for photosensitive Ag paste film 21, with overexposure and underexposure being suppressed.

Finally, developing photosensitive Ag paste film 21 exposed with the pattern of address electrode 12 in the above way, makes photosensitive Ag paste film 21 the pattern of address electrode 12; and baking it completes address electrode 12.

The above description is made for an address electrode as an example of a structure of PDP 1. However, the same effect can be achieved for a structure of PDP 1 to be formed with photolithography, such as display electrode 6, light-impervious layer 7, and partition wall 14.

Embodiment 2

FIGS. 3A through 3D illustrate a general flow of another process to form address electrode 12.

Figure 3A:
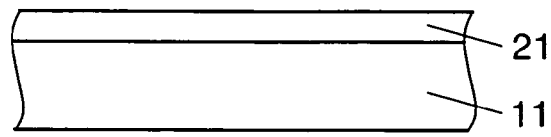
FIGS. 3A through 3D illustrate another process to form an address electrode.

First, as shown in FIG. 3A, apply a uniform coating of a photosensitive Ag paste with screen printing or the like, to form photosensitive Ag paste film 21, which becomes a precursor of address electrode 12 shown in FIG. 1.

Figure 3B:
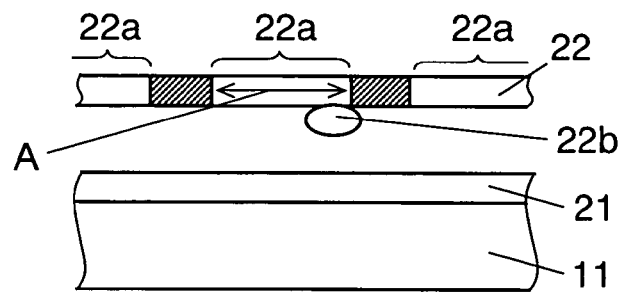

Next, as shown in FIG. 3B, arrange photomask 22 including an exposure pattern for making address electrode 12 with photolithography, positioning at a predetermined position on substrate 11. In FIG. 3B, the unhatched area of first photomask 22 is an open part of aperture width A, becoming exposure part 22a.

Figure 3C:
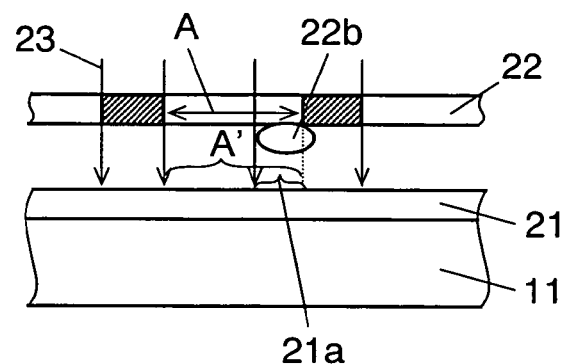
Figure 3D:
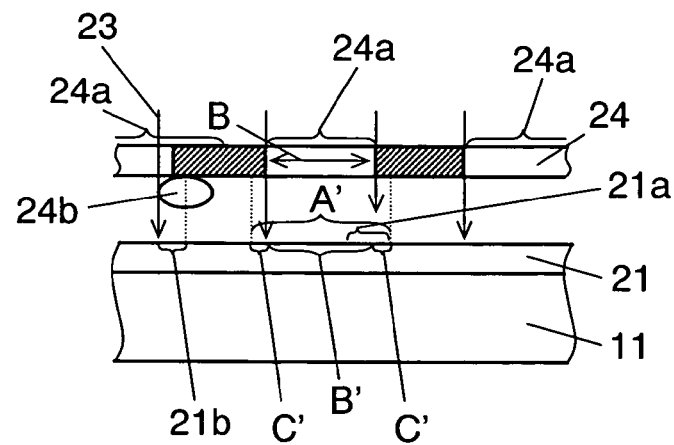

Next, as shown in FIG. 3D, perform a first exposure on photosensitive Ag paste film 21 through photomask 22. Specifically, illuminate with ultraviolet light 23 using an extra-high-pressure mercury lamp.

Next, as shown in FIG. 3D, arrange second photomask 24 including an exposure pattern that is the same as that of the first photomask 22, but is different in aperture width B of the open part, for making address electrode 12 with photolithography, positioning at a predetermined position. In FIG. 3D, the unhatched area of the second photomask 24 is an open part of aperture width B, becoming exposure part 24a.

Here, aperture width A of first photomask 22 and aperture width B of second photomask 24 are to have the following relations, in order to suppress the change in the wire width due to the displacement of regions exposed at the first and second times, due to their positioning error. That is, aperture width A of either of the photomasks, such as first photomask 22, is a predetermined aperture width to form a pattern of address electrode 12. Meanwhile, aperture width B of second photomask 24, which is the other photomask, has the same exposure pattern as that of first photomask 22, but aperture width B is to be slightly shorter than aperture width A of first photomask 22.

Then, expose second photomask 24, positioning it so that the second exposure region falls within the first exposure region exposed through first photomask 22. Here, the size of aperture width B of exposure part 24a of second photomask 24 to that of aperture width A of exposure part 22a of first photomask 22, should be determined by the exposure pattern, positioning accuracy of each photomask, and material properties such as the contraction percentage of the photosensitive material when baking.

Further, in the above-mentioned exposure, let the amount of the first exposure be different from the second. Specifically, let the amount of exposure of the photomask with the longer aperture width, namely first photomask 22 in the above-mentioned example, be larger than that of the photomask with the shorter aperture width, namely second photomask 24 in the above-mentioned example.

Additionally, for example, let the amount of exposure with first photomask 22 be approximately two thirds of that required to expose photosensitive Ag paste film 21, while the amount of exposure with second photomask 24 be approximately one third of that required to expose photosensitive Ag paste film 21. In addition, let the sum of the first and second exposure amounts not exceed that required to expose photosensitive Ag paste film 21. The above-mentioned exposure process offers a desirable pattern exposure for photosensitive Ag paste film 21, with overexposure and underexposure being suppressed, which is the same as embodiment 1 described using FIGS. 2A through 2D. Further, as shown in FIGS. 3B through 3D, even if dust 22b ends up in adhering to a part of first photomask 22, and also dust 24b to second photomask 24, its influence can be minimized.

In other words, as shown in FIG. 3C, when performing the first exposure on photosensitive Ag paste film 21 through photomask 22, if dust 22b remains attached to open part 22a of photomask 22, photosensitive Ag paste film 21 is exposed to light, actually in the region of region A', namely the region exposed through exposure part 22a of first photomask 22, with region 21a, which is corresponding to dust 22b, removed.

Next, as shown in FIG. 3D, even if dust 24b remains attached to a position of second photomask 24, the position is presumably the same as dust 22b attaching to first photomask 22 with very low probability.

Consequently, region 21b, not exposed to light due to dust 24b during the second exposure is different from region 21a, not exposed to light due to dust 22b during the first exposure, with a very high possibility. In other words, if dust 22b remains attached to first photomask 22, even if region 21a corresponding to dust 22b is not exposed to light during the first exposure, region 21a is exposed to light during the second exposure with the second photomask 24 used, with very high probability. In addition, region 21b, not exposed to light due to dust 24b during the second exposure, has been already exposed to light owing to the first exposure with very high possibility.

As described so far, in the above-mentioned example, exposure is made for a plurality of photomasks individually, and thus dust attaches to the same position of photosensitive Ag paste film 21 even after a photomask is replaced, with a very low probability. Accordingly, regions completely unexposed due to an complete interception by dust attached to the photomask, can be virtually eliminated.

Also in the above-mentioned example, the amount of exposure of the photomask with the longer aperture width, namely first photomask 22 in the above-mentioned example, is larger than that of the photomask with the shorter aperture width, namely second photomask 24 in the above-mentioned example. Further, for example, the amount of exposure with first photomask 22 is approximately two thirds of that required to expose photosensitive Ag paste film 21, while the amount of exposure with second photomask 24 is approximately one third of that required to expose photosensitive Ag paste film 21. In addition, the sum of the first and second exposure amounts do not exceed that required to expose photosensitive Ag paste film 21.

This concludes that the amount directly exposed in region 21a, namely an unexposed region after the first exposure, is only approximately one third of that required to expose photosensitive Ag paste film 21. Also, the amount directly exposed in region 21b, namely an unexposed region after the second exposure, is only approximately two thirds of that required to expose photosensitive Ag paste film 21. However, even in such cases, it has been experimentally proved that such underexposure as to cause exfoliation and the like does not occur.

Also in this case, a cross-linking reaction expands in a surface direction as well as in a film thickness direction during exposure. Therefore, even if region 21a is not directly exposed during the first exposure, a cross-linking reaction is presumably proceeding in region 21a also. Consequently, owing to an additive effect of a cross-linking reaction proceeding in such a state, and the second cross-linking reaction proceeding due to a direct exposure, insufficient exposure problematic in forming a pattern presumably does not occur, although a predetermined exposure amount is not reached. Also for region 21b, for the same reason, insufficient exposure problematic in forming a pattern presumably does not occur, although a predetermined exposure amount is not reached.

The above-mentioned method of manufacturing a PDP according to embodiment 2 of the present invention can minimize the influence of dust attached to the photomask, and also offers a desirable pattern exposure for photosensitive Ag paste film 21.

Still, the exposure amount in the above description is determined by the exposure intensity and exposure time.

INDUSTRIAL APPLICABILITY

The present invention provides, in a method of forming a structure of a PDP with photolithography, a method of manufacturing a PDP and the PDP to be manufactured therewith that suppress retroflexion, exfoliation, and the like, of a structure formed, offering a high industrial applicability.

The invention claimed is:

1. A method of manufacturing a plasma display panel, wherein:
    a structure of the plasma display panel is formed with photolithography;
    at least one of a display electrode, a black layer, an address electrode or a partition wall of the structures of the plasma display panel, in a process of forming the structure, is exposed using a plurality of photomasks with a same pattern and a different aperture width of an exposure part, with a different amount of exposure, an exposure amount radiated from the light source when the exposure is made by a photomask with a longer aperture width is larger than an exposure amount radiated from the light source when the exposure is made by a photomask with a shorter aperture width, wherein the exposure amount is determined by exposure intensity or exposure time; and
    a portion of the at least one of the display electrode, the black layer, the address electrode or the partition wall exposed by the photomask with the longer aperture width is also exposed by the photomask with the shorter aperture width.

2. A method of manufacturing a plasma display panel, wherein:
    a stripe structure of the plasma display panel is formed with photolithography;
    an exposure process of forming at least one of a display electrode, a black layer, an address electrode or a partition wall in structures of the plasma display panel, in a process of forming the structure, is processed twice using a photomask and a first exposure amount and a second exposure amount are different, wherein the exposure amount is determined by exposure intensity or exposure time, and
    a portion of the at least one of the display electrode, the black layer, the address electrode or the partition wall exposed with the first exposure amount is also exposed with the second exposure amount.

3. A method of manufacturing a plasma display panel as claimed in claim 2, wherein a larger amount of exposure is approximately two thirds of a total amount of exposure required.

4. A method of manufacturing the plasma display panel as claimed in claim 2, wherein either the first exposure amount or the second exposure amount is approximately two thirds of a total amount of exposure required.

5. A method of manufacturing the plasma display panel as claimed in claim 1, wherein at least one of the structure, immediately after the exposure, a progress speed of a cross-linking reaction is different between at an edge part and a central part of the pattern shape, and the central part proceeds the edge part.

6. A method of manufacturing the plasma display panel as claimed in claim 2, wherein at least one of the structure, immediately after the exposure, a progress speed of a cross-linking reaction is different between at an edge part and a central part of the pattern shape, and the central part proceeds the edge part.

7. A method of manufacturing the plasma display panel as claimed in claim 1, wherein the exposure process is a process for forming an address electrode, and the exposure is made to a photosensitive Ag paste film.

8. A method of manufacturing the plasma display panel as claimed in claim 2, wherein the exposure process is a process for forming an address electrode, and the exposure is made to a photosensitive Ag paste film.

9. A method of manufacturing the plasma display panel as claimed in claim 1, wherein the exposure amount is determined by controlling the exposure intensity.

10. A method of manufacturing the plasma display panel as claimed in claim 1, wherein the exposure amount is determined by controlling the exposure time.

11. A method of manufacturing the plasma display panel as claimed in claim 2, wherein the exposure amount is determined by controlling the exposure intensity.

12. A method of manufacturing the plasma display panel as claimed in claim 2, wherein the exposure amount is determined by controlling the exposure time.

13. A method of manufacturing the plasma display panel as claimed in claim 1, wherein the exposure amount is determined by controlling the exposure intensity or exposure time.

14. A method of manufacturing the plasma display panel as claimed in claim 2, wherein the exposure amount is determined by controlling the exposure intensity or exposure time.

15. A method of manufacturing the plasma display panel as claimed in claim 1, wherein the exposure amount radiated from the light source when the exposure is made by the photomask with the longer aperture width is two thirds of a total amount of exposure required.

16. A method of manufacturing the plasma display panel as claimed in claim 1, wherein the exposure amount radiated from the light source when the exposure is made by the photomask with the shorter aperture width is one third of a total amount of exposure required.

17. A method of manufacturing the plasma display panel as claimed in claim 2, wherein the first exposure is two thirds of a total amount of exposure required and the second exposure is one third of the exposure amount required.

* * * * *